United States Patent
Imamura et al.

(10) Patent No.: US 8,766,351 B2
(45) Date of Patent: Jul. 1, 2014

(54) SEMICONDUCTOR STORAGE DEVICE AND MANUFACTURING METHOD OF SEMICONDUCTOR STORAGE DEVICE

(75) Inventors: Takeshi Imamura, Kanagawa (JP); Yoshiaki Fukuzumi, Kanagawa (JP); Hideaki Aochi, Kanagawa (JP); Masaru Kito, Kanagawa (JP); Tomoko Fujiwara, Kanagawa (JP); Kaori Kawasaki, Kanagawa (JP); Ryouhei Kirisawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 189 days.

(21) Appl. No.: 13/112,345

(22) Filed: May 20, 2011

(65) Prior Publication Data

US 2012/0132981 A1 May 31, 2012

(30) Foreign Application Priority Data

Nov. 30, 2010 (JP) .................................. 2010-266984

(51) Int. Cl.
*H01L 29/788* (2006.01)
(52) U.S. Cl.
USPC ........... 257/321; 257/315; 257/316; 438/211; 438/257
(58) Field of Classification Search
USPC ................. 257/314–316, 324, 326, 329, 321; 438/201, 264, 268, 269, 588, 211, 257
See application file for complete search history.

(56) References Cited

U.S. PATENT DOCUMENTS

| 2004/0004863 | A1* | 1/2004 | Wang ............................. 365/199 |
| 2007/0290253 | A1 | 12/2007 | Kito et al. |
| 2008/0070364 | A1* | 3/2008 | Zheng et al. .................. 438/268 |
| 2009/0230459 | A1 | 9/2009 | Kito et al. |
| 2010/0148237 | A1 | 6/2010 | Kito et al. |
| 2010/0167479 | A1* | 7/2010 | Bhattacharyya .............. 438/259 |
| 2010/0181612 | A1 | 7/2010 | Kito et al. |
| 2010/0207185 | A1* | 8/2010 | Lee et al. ....................... 257/314 |
| 2010/0240205 | A1* | 9/2010 | Son et al. ....................... 438/588 |

FOREIGN PATENT DOCUMENTS

JP 2009-224468 10/2009

OTHER PUBLICATIONS

SungJin Whang, et al, "Novel 3-Dimensional Dual Control-Gate with Surrounding Floating-Gate (DC-SF) NAND Flash Cell for 1Tb File Storage Application," 2010, pp. 29.7.1-29.7.4, IEEE IEDM10-671.

* cited by examiner

*Primary Examiner* — Errol Fernandes
(74) *Attorney, Agent, or Firm* — Oblon, Spivak, McClelland, Maier & Neustadt, L.L.P.

(57) ABSTRACT

According to one embodiment, a columnar semiconductor, a floating gate electrode formed on a side surface of the columnar semiconductor via a tunnel dielectric film, and a control gate electrode formed to surround the floating gate electrode via a block dielectric film are provided.

12 Claims, 11 Drawing Sheets

SEMICONDUCTOR STORAGE DEVICE AND MANUFACTURING METHOD OF SEMICONDUCTOR STORAGE DEVICE

CROSS-REFERENCE TO RELATED APPLICATIONS

This application is based upon and claims the benefit of priority from the prior Japanese Patent Application No. 2010-266984, filed on Nov. 30, 2010; the entire contents of which are incorporated herein by reference.

FIELD

Embodiments described herein relate generally to a semiconductor storage device and a manufacturing method of a semiconductor storage device.

BACKGROUND

There are proposed various semiconductor devices in which memory cells are three-dimensionally arranged for improving the integration density of a memory. In most conventional semiconductor storage devices in which memory cells are three-dimensionally arranged, a photolithography process and a processing process such as etching need to be performed for each layer of a memory cell portion. In the conventional three-dimensionally-stacked semiconductor storage device, memory cells are simply stacked in most cases and therefore cost increase due to the three-dimensional structure is inevitable.

In most of the above described three-dimensional nonvolatile semiconductor devices, a charge storage layer is formed around a columnar semiconductor layer and it is difficult to improve a coupling ratio between the charge storage layer and a control gate electrode in a memory cell portion for each layer.

DETAILED DESCRIPTION

In general, according to one embodiment, a columnar semiconductor, a tunnel dielectric film, a floating gate electrode, a block dielectric film, and a control gate electrode are provided. The tunnel dielectric film is provided on a side surface of the columnar semiconductor. The floating gate electrode is provided to face the columnar semiconductor via the tunnel dielectric film. The block dielectric film is provided to surround the floating gate electrode. The control gate electrode is provided to surround the floating gate electrode via the block dielectric film.

A semiconductor storage device and a manufacturing method of a semiconductor storage device according to the embodiments will be explained below with reference to the drawings. The present invention is not limited to these embodiments.

First Embodiment

Figure 1:
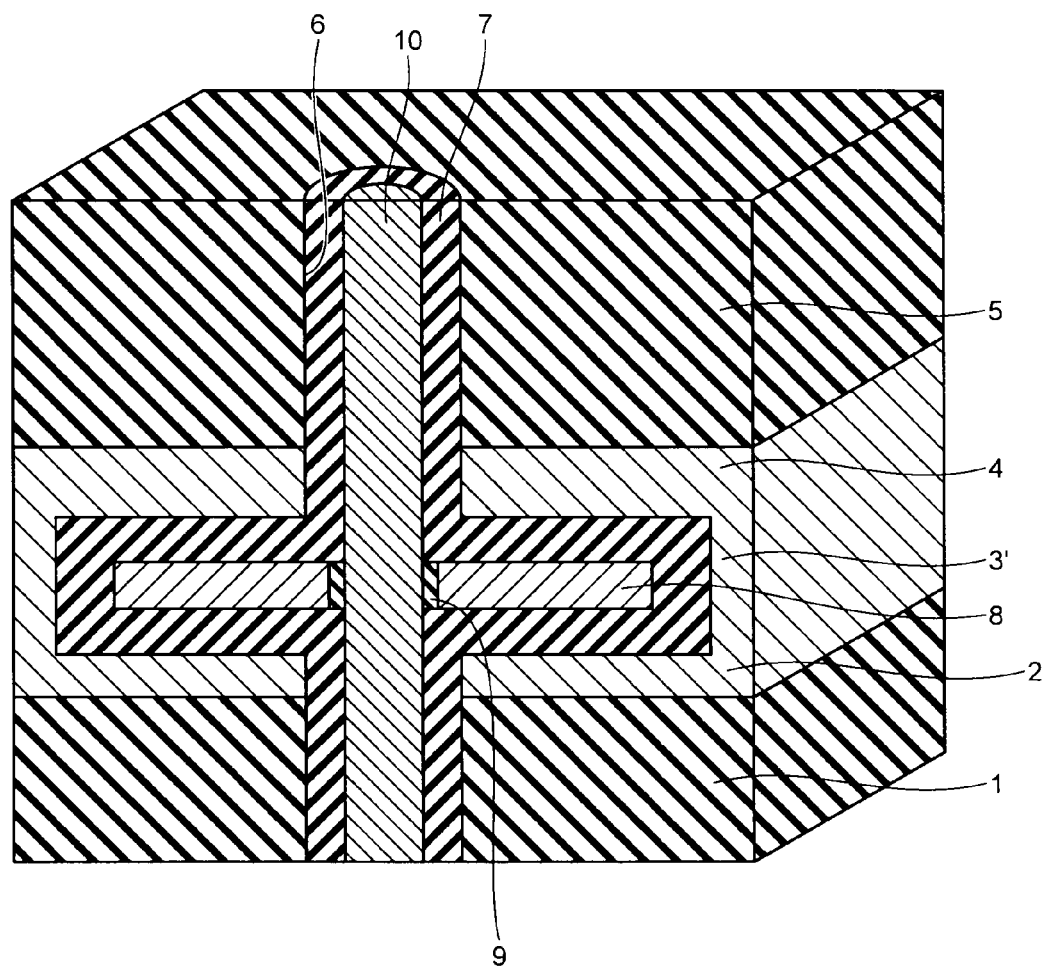
FIG. 1 is a partial cross-sectional view illustrating a schematic configuration of a semiconductor storage device according to a first embodiment.

FIG. 1 is a partial cross-sectional view illustrating a schematic configuration of a semiconductor storage device according to the first embodiment.

In FIG. 1, a floating gate electrode 8 is formed on a side surface of a columnar semiconductor 10 via a tunnel dielectric film 9. A channel region can be formed in the columnar semiconductor 10.

Control gate electrodes 2 and 4 are formed on the upper and lower sides of the floating gate electrode 8 via a block dielectric film 7. The floating gate electrode 8 can be configured to surround the columnar semiconductor 10 in a ring shape. The control gate electrodes 2 and 4 can be arranged on the side surface of the columnar semiconductor 10 via the block dielectric film 7. A control gate electrode 3' is formed on the outer peripheral sidewall of the floating gate electrode 8 via the block dielectric film 7 and the floating gate electrode 8 is surrounded by the control gate electrodes 2, 3', and 4 via the block dielectric film 7. When the control gate electrodes 2, 3', and 4 are formed of polycrystalline silicon doped with impurities, the impurity concentration of the control gate electrode 3' can be lower than the impurity concentration of the control gate electrodes 2 and 4.

An inter-layer dielectric film 1 is formed under the control gate electrode 2 and an inter-layer dielectric film 5 is formed over the control gate electrode 4. A through hole 6 is formed in the inter-layer dielectric films 1 and 5 and the control gate electrodes 2 and 4. The columnar semiconductor 10 is embedded in the through hole 6 via the block dielectric film 7 to penetrate through the floating gate electrode 8.

For example, a doped semiconductor doped with N-type impurities can be used for the control gate electrodes 2, 3', and 4, and a polycrystalline semiconductor can be used for the floating gate electrode 8 and the columnar semiconductor 10. As these semiconductors, for example, Si, Ge, SiGe, SiC, SiSn, PbS, GaAs, InP, GaP, GaN, InGaAsP, or ZnSe can be used. Moreover, for example, a silicon oxide film can be used for the block dielectric film 7, the tunnel dielectric film 9, and the inter-layer dielectric film 1.

In the above first embodiment, the floating gate electrode 8 is surrounded by the control gate electrodes 2, 3', and 4. Therefore, the coupling ratio between the control gate electrodes 2, 3', and 4 and the floating gate electrode 8 can be improved while suppressing complication of the manufacturing process.

An applied voltage to the control gate electrodes 2, 3', and 4 can be made small by improving the coupling ratio between the control gate electrodes 2, 3', and 4 and the floating gate electrode 8, and therefore power consumption can be reduced.

Moreover, a threshold voltage can be reduced by improving the coupling ratio between the control gate electrodes 2, 3', and 4 and the floating gate electrode 8. Therefore, a driving current of a memory cell can be increased, enabling to improve the operation speed.

Furthermore, the floating gate electrode 8 is used as a charge storage layer, so that erasing can be performed by tunneling electrons via the tunnel dielectric film 9. Therefore, erasing time can be shortened compared with the case of using a dielectric film, and therefore the erasing efficiency can be improved.

Moreover, the floating gate electrode 8 is used as a charge storage layer, so that electric field concentration can be suppressed from occurring at the floating gate electrode 8. Therefore, even in the case where the floating gate electrode 8 is surrounded by the control gate electrodes 2, 3', and 4, the electric field applied to the floating gate electrode 8 via the control gate electrodes 2, 3', and 4 can be made uniform, and the coupling ratio between the control gate electrodes 2, 3', and 4 and the floating gate electrode 8 can be improved.

In the embodiment in FIG. 1, explanation is given for the method of arranging the control gate electrodes 2 and 4 on the side surface of the columnar semiconductor 10 via the block dielectric film 7, however, the control gate electrodes 2 and 4 can be arranged on the side surface of the columnar semiconductor 10 via a tunnel dielectric film.

Moreover, in the embodiment in FIG. 1, the configuration in which a memory cell is provided only for one layer is explained, however, the memory cell in FIG. 1 can be stacked for n layers in a height direction of the columnar semiconductor 10.

Second Embodiment

FIG. 2A to FIG. 4B are cross-sectional views illustrating a manufacturing method of a semiconductor storage device according to the second embodiment.

Figure 2A:
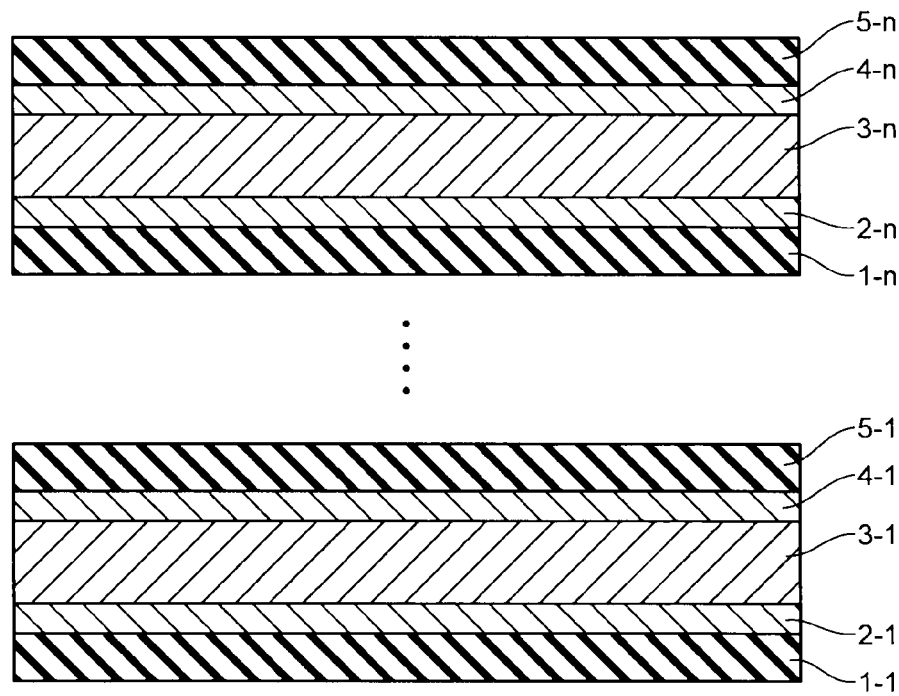
FIGS. 2A and 2B are cross-sectional views illustrating a manufacturing method of a semiconductor storage device according to a second embodiment.

In FIG. 2A, an inter-layer dielectric film 1-$n$, a nonselective semiconductor layer 2-$n$, a selective semiconductor layer 3-$n$, a nonselective semiconductor layer 4-$n$, and an inter-layer dielectric film 5-$n$ are sequentially stacked n times by a method such as the CVD. The film formation temperature at this time can be set to 600° C. or lower. The selective semiconductor layer 3-$n$ can be configured such that the etch selectivity is higher than that of the nonselective semiconductor layers 2-$n$ and 4-$n$. For example, a doped semiconductor layer in which impurities such as boron are introduced can be used for the nonselective semiconductor layers 2-$n$ and 4-$n$, and a non-doped semiconductor layer with no impurity introduced therein can be used for the selective semiconductor layer 3-$n$. Alternatively, it is possible to use semiconductor materials with different etch selectivity in combination.

For example, the nonselective semiconductor layers 2-$n$ and 4-$n$ can be formed of Si and the selective semiconductor layer 3-$n$ can be formed of SiGe.

Figure 2B:
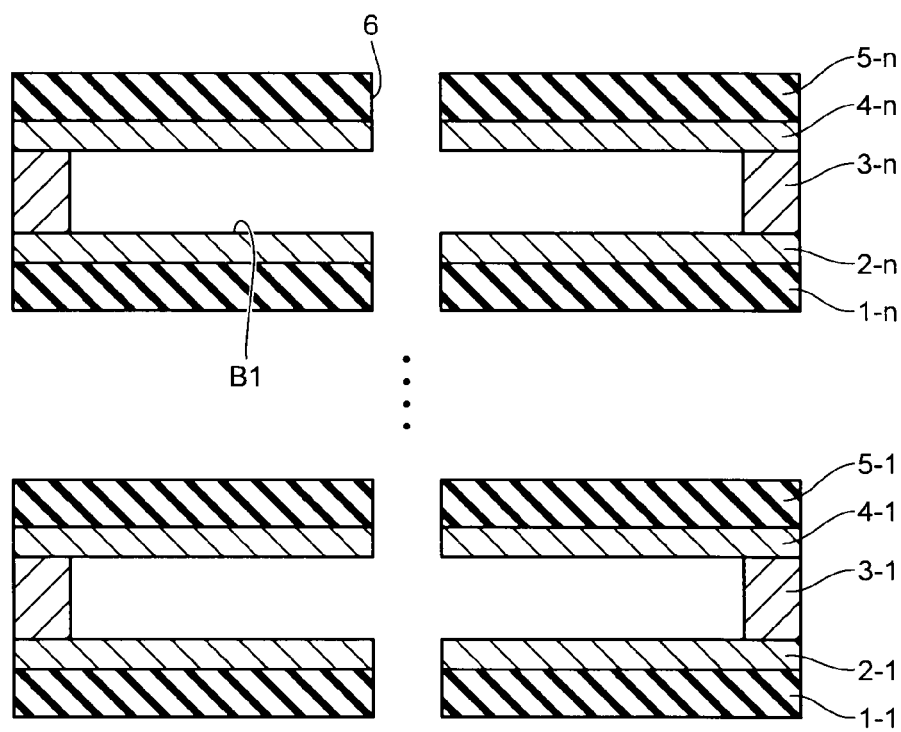

Next, as shown in FIG. 2B, the through hole 6 is formed in the inter-layer dielectric film 1-$n$, the nonselective semiconductor layer 2-$n$, the selective semiconductor layer 3-$n$, the nonselective semiconductor layer 4-$n$, and the inter-layer dielectric film 5-$n$ by using the photolithography technology and the dry etching technology. The etching temperature at this time can be set to 600° C. or lower.

Then, the selective semiconductor layer 3-$n$ is selectively etched partway in a horizontal direction through the through hole 6 to form a recess portion B1 between the nonselective semiconductor layers 2-$n$ and 4-$n$. A wet etching can be used as the etching at this time. When a boron-doped polycrystalline silicon layer is used as the nonselective semiconductor layers 2-$n$ and 4-$n$ and a non-doped polycrystalline silicon layer is used as the selective semiconductor layer 3-$n$, the etch selectivity of 1000 or more can be ensured.

Figure 3A:
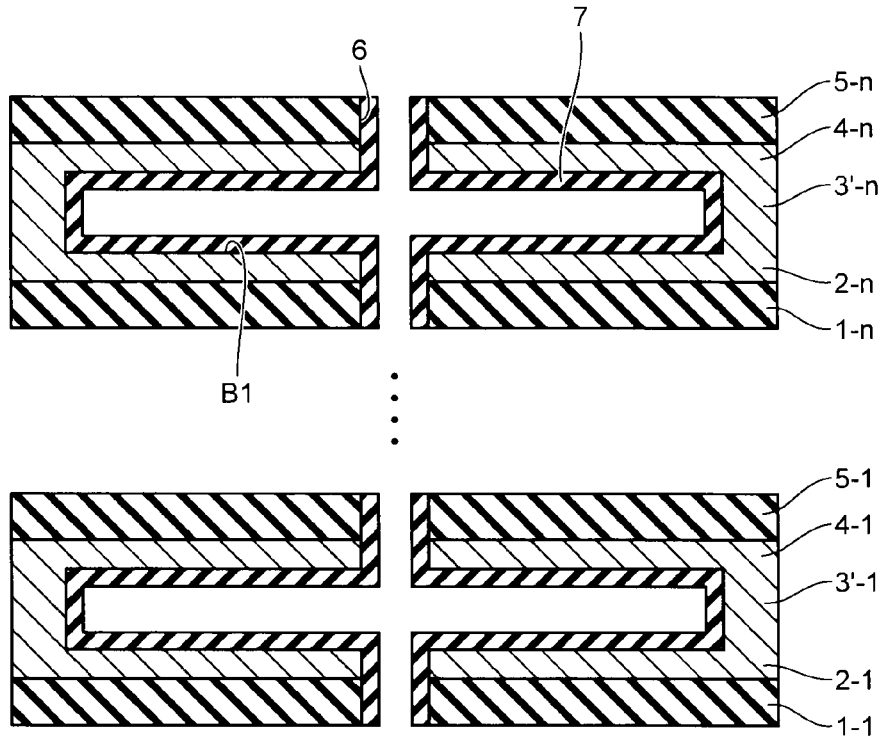
FIGS. 3A and 3B are cross-sectional views illustrating the manufacturing method of the semiconductor storage device according to the second embodiment.

Next, as shown in FIG. 3A, the block dielectric film 7 is formed on the sidewall of the through hole 6 to cover the surface of the recess portion B1 between the nonselective semiconductor layers 2-$n$ and 4-$n$ by using a method such as the CVD. For example, a silicon oxide film can be used as the block dielectric film 7. At this time, when a doped semiconductor layer is used as the nonselective semiconductor layers 2-$n$ and 4-$n$ and a non-doped semiconductor layer is used as the selective semiconductor layer 3-$n$, the selective semiconductor layer 3-$n$ is changed into a nonselective semiconductor layer 3'-$n$ by diffusing impurities in the nonselective semiconductor layers 2-$n$ and 4-$n$ into the selective semiconductor layer 3-$n$, thereby enabling to surround the periphery of the recess portion B1 by the nonselective semiconductor layers 2-$n$, 3'-$n$, and 4-$n$. For example, at this time, the film formation temperature can be set to 1000° C. and the film formation time can be set to 20 seconds.

Figure 3B:
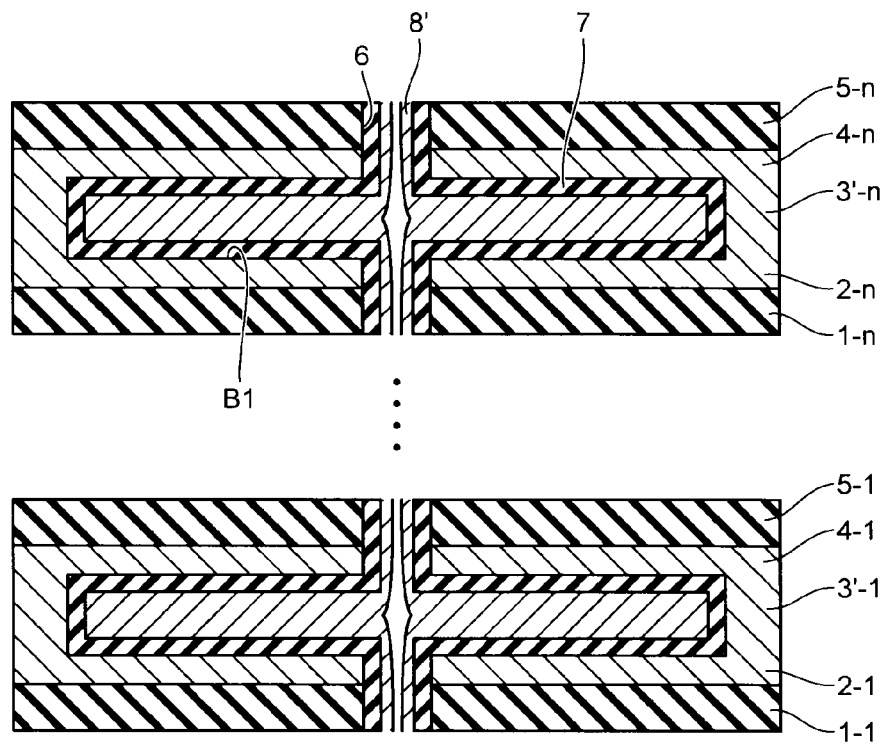

Next, as shown in FIG. 3B, a polycrystalline semiconductor film 8' is formed on the sidewall of the block dielectric film 7 to fill the recess portion B1 through the through hole 6 by using a method such as the CVD. For example, a polycrystalline silicon film can be used as the polycrystalline semiconductor film 8'.

Figure 4A:
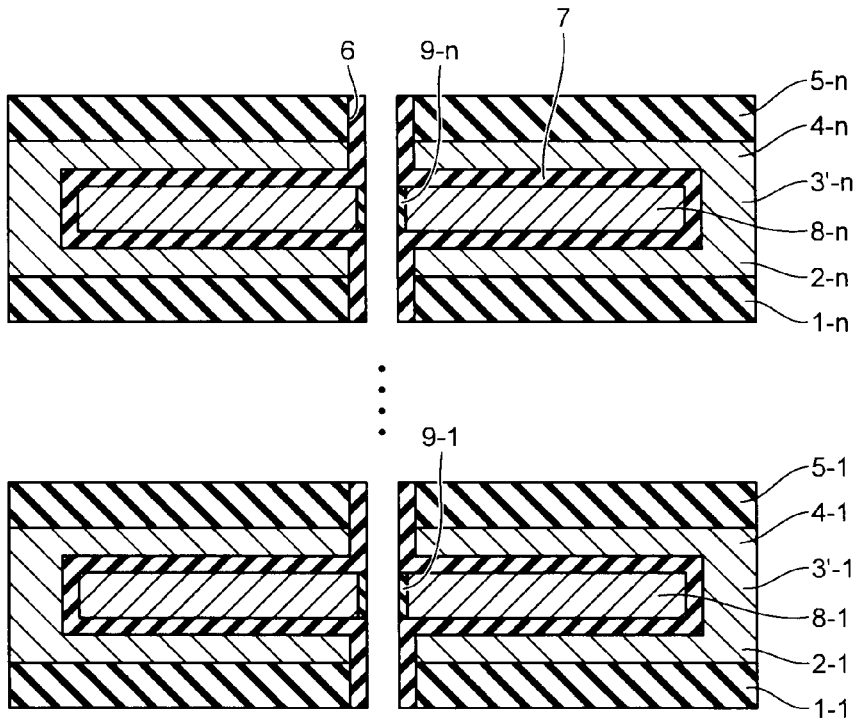
FIGS. 4A and 4B are cross-sectional views illustrating the manufacturing method of the semiconductor storage device according to the second embodiment.

Next, as shown in FIG. 4A, the polycrystalline semiconductor film 8' is retracted by using a method such as a wet etching to remove the polycrystalline semiconductor film 8' on the sidewall of the block dielectric film 7 in a state where the polycrystalline semiconductor film 8' is embedded in the recess portion B1, thereby forming a floating gate electrode 8-$n$ in the recess portion B1. Then, a tunnel dielectric film 9-$n$ is formed on the surface of the floating gate electrode 8-$n$ exposed on the opening side of the recess portion B1 by using a method such as a thermal oxidation. For example, a tunnel oxide film can be used as the tunnel dielectric film 9-$n$. The tunnel dielectric film 9-$n$ can be formed by the CVD or the like. When the tunnel dielectric film 9-$n$ is formed by the CVD or the like, the tunnel dielectric film 9-$n$ is formed on the surfaces of the floating gate electrode 8-$n$ and the block dielectric film 7 on the sidewall of the through hole 6.

Figure 4B:
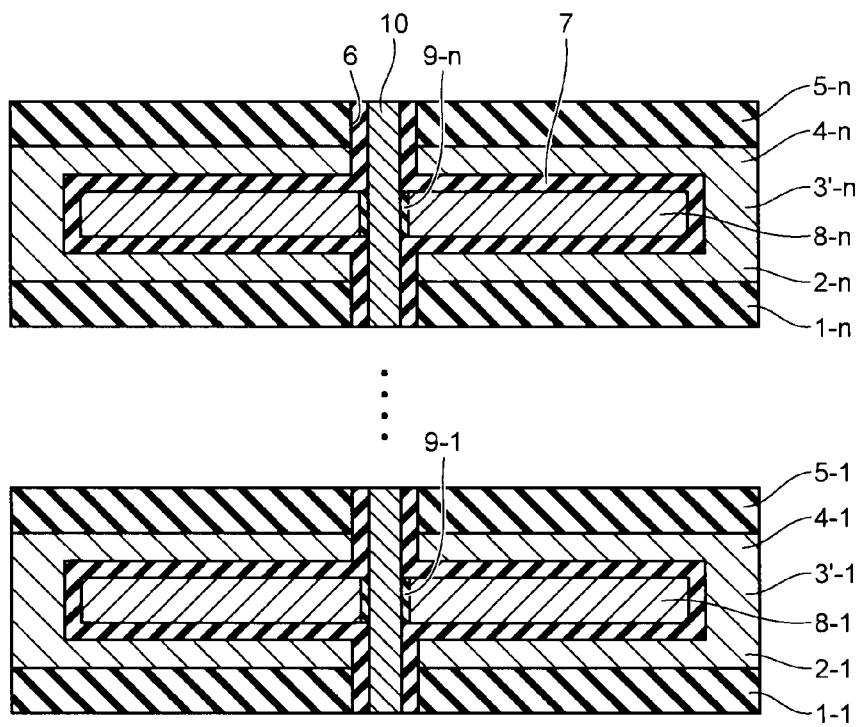

Next, as shown in FIG. 4B, the columnar semiconductor 10 is embedded in the through hole 6 by using a method such as the CVD. A channel region can be formed in the columnar semiconductor 10. For example, a polycrystalline silicon film can be used as the columnar semiconductor 10.

In the above second embodiment, the structure in the first embodiment can be realized while suppressing complication of the manufacturing process. Specifically, because the semiconductor layer 3-$n$ is changed into the semiconductor layer 3'-n by diffusing the impurities from the doped semiconductor layers 2-n and 4-n into the semiconductor layer 3-n, there is no need to add a complicated film forming process such as the lithography. Moreover, the semiconductor layer 3'-n can be formed without performing an additional thermal process by diffusing impurities with heat in the CVD process or the like. Therefore, three-dimensional integration of the semiconductor storage device can be realized while suppressing increase in the number of processes and the coupling ratio between the control gate electrodes 2, 3', and 4 and the floating gate electrode 8 can be improved.

Third Embodiment

Figure 5:
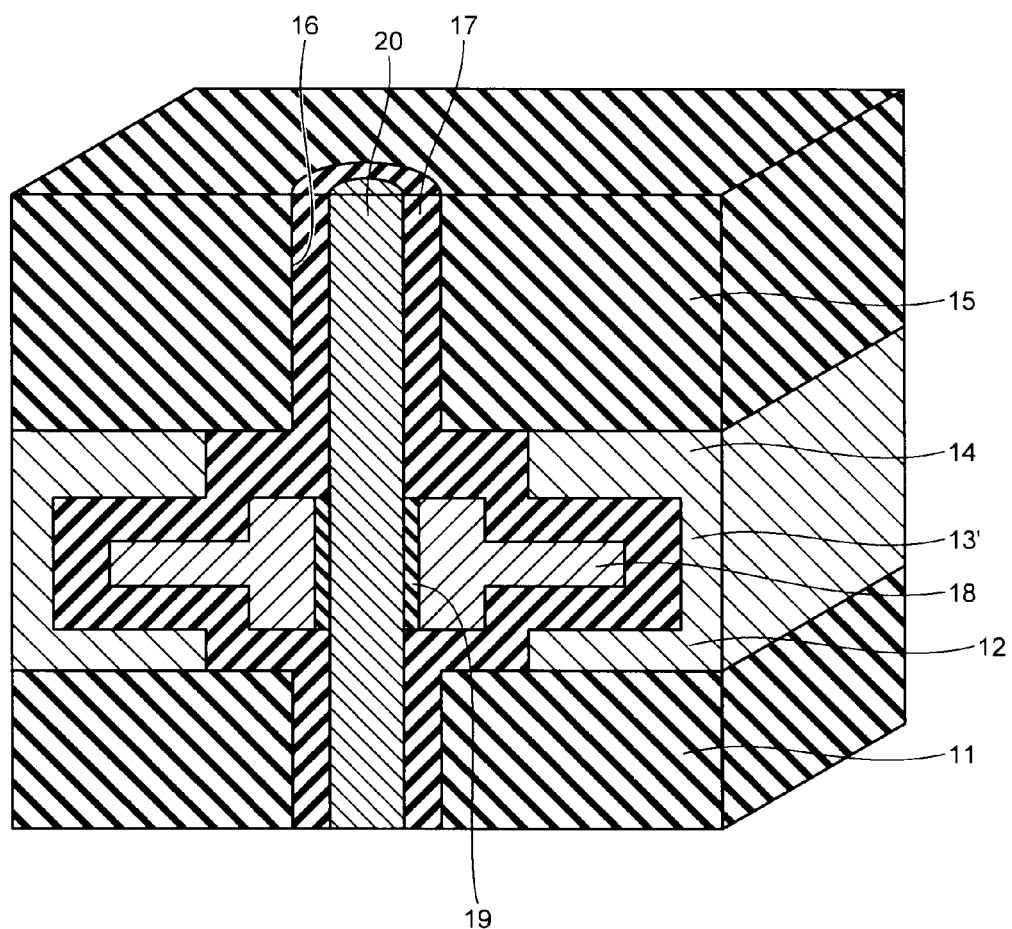
FIG. 5 is a cross-sectional view illustrating a manufacturing method of a semiconductor storage device according to a third embodiment.

FIG. 5 is a partial cross-sectional view illustrating a schematic configuration of a semiconductor storage device according to the third embodiment.

In FIG. 5, a floating gate electrode 18 is formed on a side surface of a columnar semiconductor 20 via a tunnel dielectric film 19. A channel region can be formed in the columnar semiconductor 20. The floating gate electrode 18 is configured such that a portion closer to the columnar semiconductor 20 is thicker than a portion further from the columnar semiconductor 20. For example, it is possible to form an upward step from the portion further from the columnar semiconductor 20 toward the portion closer to the columnar semiconductor 20 on the floating gate electrode 18. This upward step is preferably provided on both the upper and lower surfaces of the floating gate electrode 18.

Control gate electrodes 12 and 14 are formed on the upper and lower sides of the floating gate electrode 18 via a block dielectric film 17. The control gate electrodes 12 and 14 can be formed to extend over the thin portion of the floating gate electrode 18 and not to extend over the thick portion of the floating gate electrode 18. The floating gate electrode 18 can be configured to surround the columnar semiconductor 20 in a ring shape. The control gate electrodes 12 and 14 can be arranged on the side surface of the columnar semiconductor 20 via the block dielectric film 17. A control gate electrode 13' is formed on the outer peripheral sidewall of the floating gate electrode 18 via the block dielectric film 17, and the thin portion of the floating gate electrode 18 is surrounded by the control gate electrodes 12, 13' and 14 via the block dielectric film 17.

An inter-layer dielectric film 11 is formed under the control gate electrodes 12 and an inter-layer dielectric film 15 is formed over the control gate electrode 14. A through hole 16 is formed in the inter-layer dielectric films 11 and 15. The columnar semiconductor 20 is embedded in the through hole 16 via the block dielectric film 17 to penetrate through the floating gate electrode 18.

The floating gate electrode 18 is surrounded by the control gate electrodes 12, 13' and 14. Therefore, the coupling ratio between the control gate electrodes 12, 13' and 14 and the floating gate electrode 18 can be improved and the threshold voltage can be easily adjusted. The floating gate electrode 18 is configured such that the portion closer to the columnar semiconductor 20 is thicker than the portion further from the columnar semiconductor 20, so that the area of the floating gate electrode 18 facing the columnar semiconductor 20 can be made large compared with the first embodiment, whereby the threshold of the memory cell can be easily adjusted. In addition, in the present embodiment, the control gate electrode 12 is formed to be apart from the columnar semiconductor 20 by the film thickness of the block dielectric film 17 or more different from the first embodiment. Specifically, the distance between the control gate electrodes 12 and 14 and the columnar semiconductor 20 that face each other becomes larger than the distance between the inter-layer dielectric films 11 and 15 and the columnar semiconductor 20 that face each other, so that leakage can be suppressed compared with the above first embodiment, which is desirable.

In the embodiment in FIG. 5, explanation is given for the method of arranging the control gate electrodes 12 and 14 on the side surface of the columnar semiconductor 20 via the block dielectric film 17, however, the control gate electrodes 12 and 14 can be arranged on the side surface of the columnar semiconductor 20 via a tunnel dielectric film.

Moreover, in the embodiment in FIG. 5, the configuration in which a memory cell is provided only for one layer is explained, however, the memory cell in FIG. 5 can be stacked for n layers in a height direction of the columnar semiconductor 20.

Fourth Embodiment

FIG. 6A to FIG. 9B are cross-sectional views illustrating a manufacturing method of a semiconductor storage device according to the fourth embodiment.

Figure 6A:
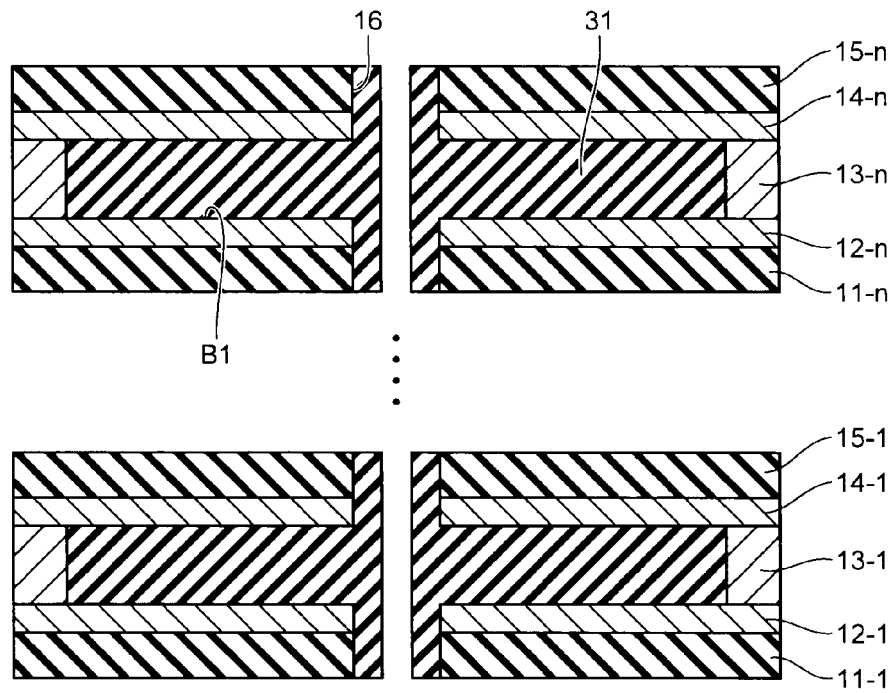
FIGS. 6A and 6B are cross-sectional views illustrating a manufacturing method of a semiconductor storage device according to a fourth embodiment.

In FIG. 6A, an inter-layer dielectric film 11-n, a nonselective semiconductor layer 12-n, a selective semiconductor layer 13-n, a nonselective semiconductor layer 14-n, and an inter-layer dielectric film 15-n are sequentially stacked n times through processes similar to FIG. 2A and FIG. 2B. After forming the through hole 16 in the inter-layer dielectric film 11-n, the nonselective semiconductor layer 12-n, the selective semiconductor layer 13-n, the nonselective semiconductor layer 14-n, and the inter-layer dielectric film 15-n, the recess portion B1 is formed between the nonselective semiconductor layers 12-n and 14-n.

Then, a sacrifice film 31 is formed on the side surfaces of the inter-layer dielectric films 11-n and 15-n and the nonselective semiconductor layers 12-n and 14-n to fill the recess portion B1 through the through hole 16 by using a method such as the CVD. For the sacrifice film 31, it is possible to use a material whose etch selectivity is smaller than that of the nonselective semiconductor layers 12-n and 14-n, and for example, a silicon nitride film can be used.

Figure 6B:
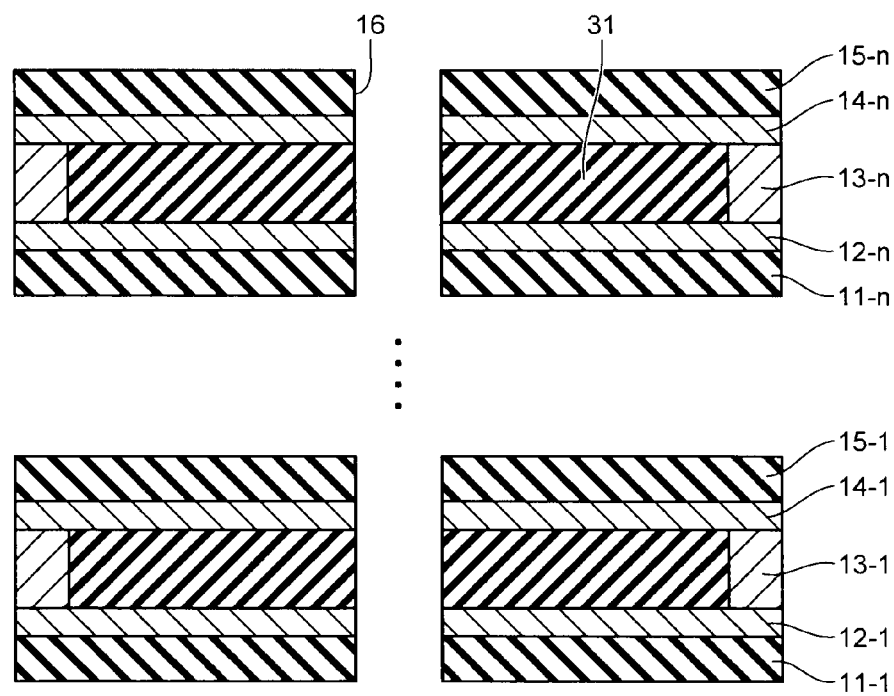

Next, as shown in FIG. 6B, the sacrifice film 31 is retracted by using a method such as a wet etching to remove the sacrifice film 31 on the sidewalls of the inter-layer dielectric films 11-n and 15-n and the nonselective semiconductor layers 12-n and 14-n in a state where the sacrifice film 31 is embedded in the recess portion B1.

Figure 7A:
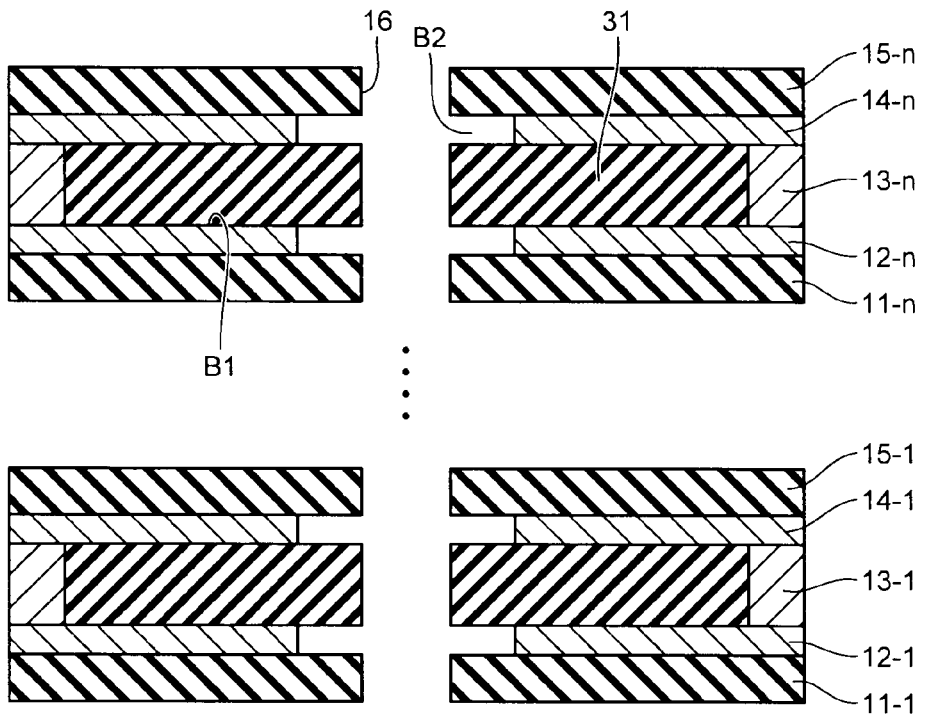
FIGS. 7A and 7B are cross-sectional views illustrating the manufacturing method of the semiconductor storage device according to the fourth embodiment.

Next, as shown in FIG. 7A, the nonselective semiconductor layers 12-n and 14-n are selectively etched partway in a horizontal direction through the through hole 16 to form recess portions B2 between the inter-layer dielectric films 11-n and 15-n and the sacrifice film 31. A wet etching can be used for the etching at this time.

Figure 7B:
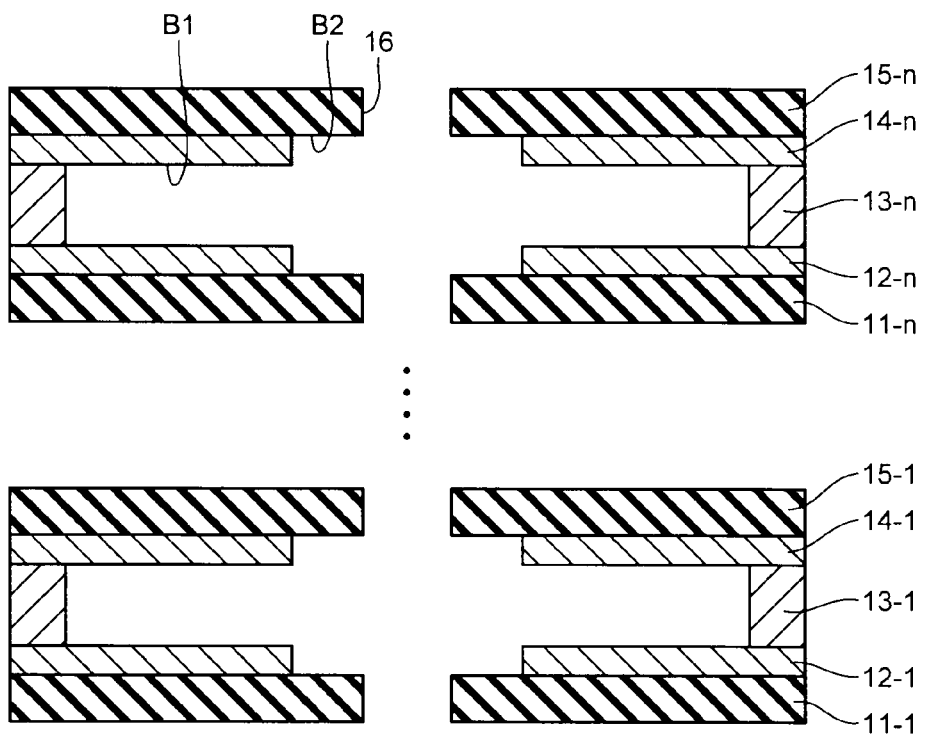

Next, as shown in FIG. 7B, the sacrifice film 31 is removed by using a method such as a wet etching to form steps corresponding to the recess portions B2 in the recess portion B1.

Figure 8A:
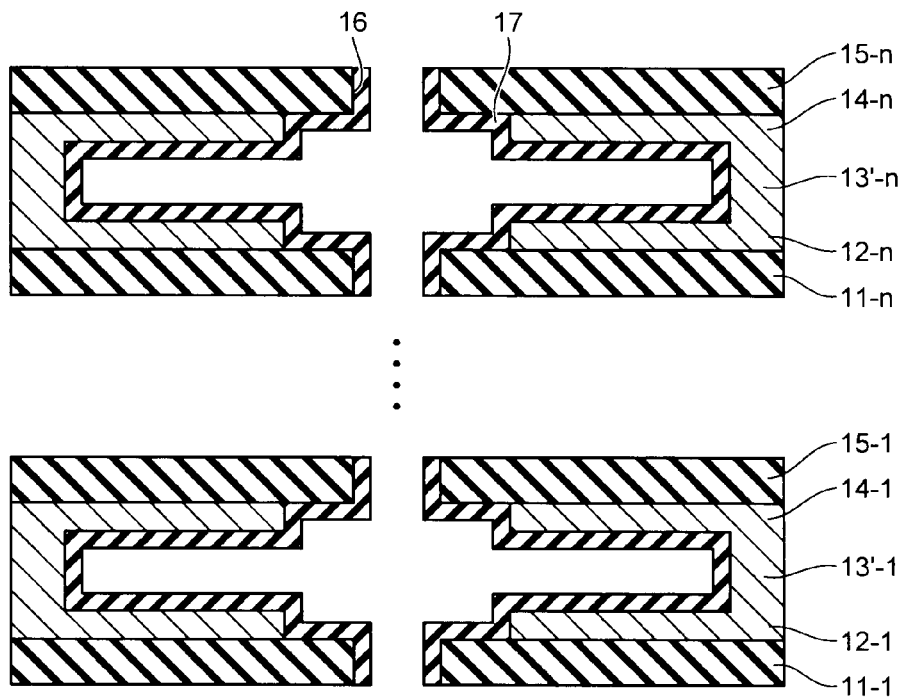
FIGS. 8A and 8B are partial cross-sectional views illustrating a schematic configuration of a semiconductor storage device according to the fourth embodiment.

Next, as shown in FIG. 8A, the block dielectric film 17 is formed on the sidewall of the through hole 16 to cover the surfaces of the recess portion B1 and the steps corresponding to the recess portions B2 by using a method such as the CVD. At this time, when a doped semiconductor layer is used as the nonselective semiconductor layers 12-n and 14-n and a non-doped semiconductor layer is used as the selective semiconductor layer 13-n, the selective semiconductor layer 13-n is changed into a nonselective semiconductor layer 13'-n by diffusing impurities in the nonselective semiconductor layers 12-n and 14-n into the selective semiconductor layer 13-n, thereby enabling to surround the periphery of the recess portion B1 by the nonselective semiconductor layers 12-$n$, 13'-$n$, and 14-$n$.

Figure 8B:
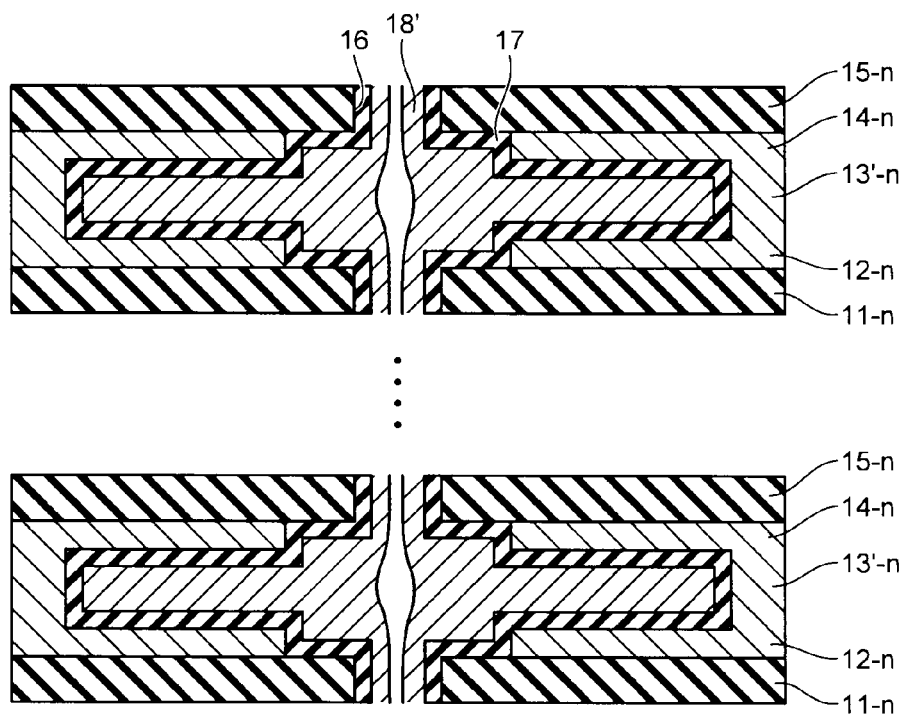

Next, as shown in FIG. 8B, a polycrystalline semiconductor film 18' is formed on the sidewall of the block dielectric film 17 to fill the recess portion B1 and the steps corresponding to the recess portions B2 through the through hole 16 by using a method such as the CVD.

Figure 9A:
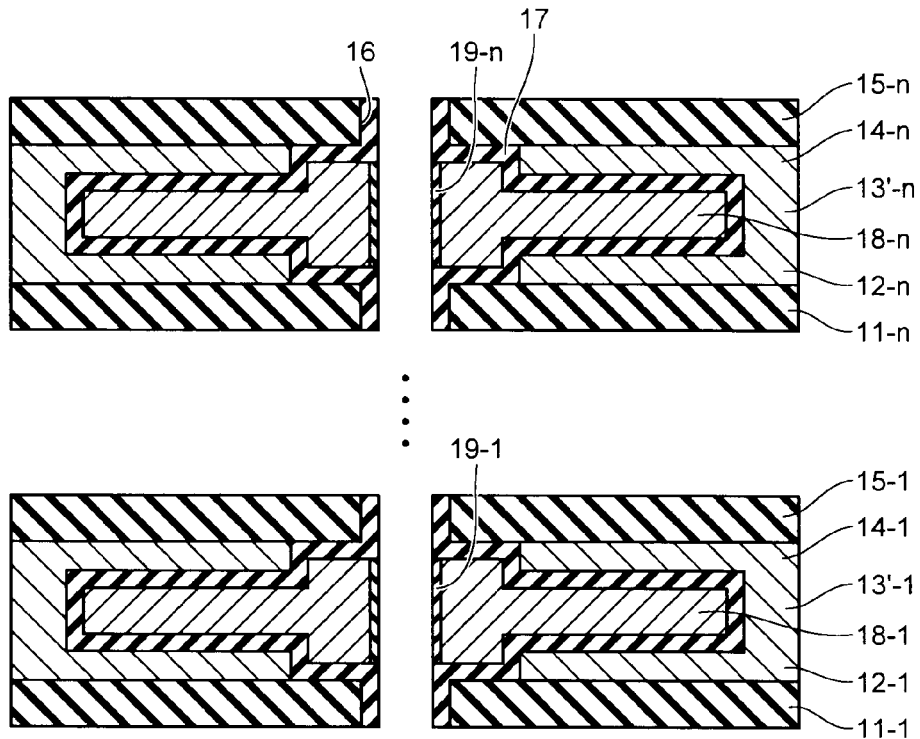
FIGS. 9A and 9B are cross-sectional views illustrating the manufacturing method of the semiconductor storage device according to the fourth embodiment.

Next, as shown in FIG. 9A, the polycrystalline semiconductor film 18' is retracted by using a method such as a wet etching to remove the polycrystalline semiconductor film 18' on the sidewall of the block dielectric film 17 in a state where the polycrystalline semiconductor film 18' is embedded in the recess portion B1 and the steps corresponding to the recess portions B2, thereby forming a floating gate electrode 18-$n$ in the recess portion B1 and the steps corresponding to the recess portions B2. Then, a tunnel dielectric film 19-$n$ is formed on the surface of the floating gate electrode 18-$n$ exposed on the opening side of the recess portion B1 by using a method such as a thermal oxidation. The tunnel dielectric film 19-$n$ can be formed by the CVD or the like. When the tunnel dielectric film 19-$n$ is formed by the CVD or the like, the tunnel dielectric film 19-$n$ is formed on the surfaces of the floating gate electrode 18-$n$ and the block dielectric film 17 on the sidewall of the through hole 16.

Figure 9B:
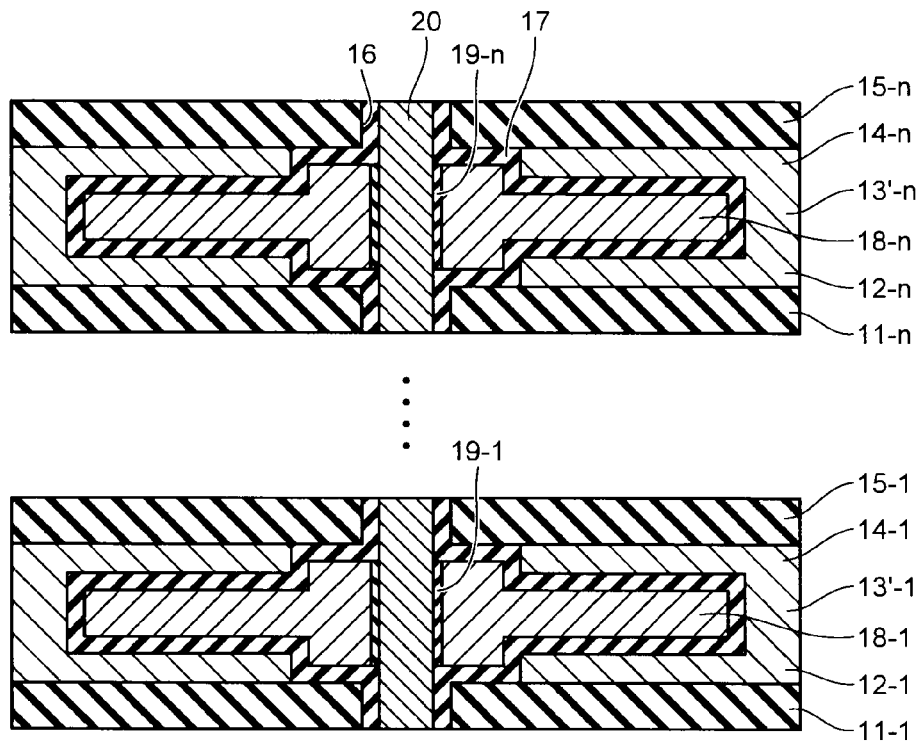

Next, as shown in FIG. 9B, the columnar semiconductor 20 is embedded in the through hole 16 by using a method such as the CVD. A channel region can be formed in the columnar semiconductor 20.

In the above fourth embodiment, the structure in the third embodiment can be realized while suppressing complication of the manufacturing process. Specifically, because the semiconductor layer 13-$n$ is changed into the semiconductor layer 13'-$n$ by diffusing the impurities from the doped semiconductor layers 12-$n$ and 14-$n$ into the semiconductor layer 13-$n$, there is no need to add a complicated film forming process such as the lithography. Moreover, the semiconductor layer 13'-$n$ can be formed without performing an additional thermal process by diffusing impurities with heat in the CVD process or the like. Furthermore, the structure in the third embodiment can be realized by the process without via the lithography process by retracting the semiconductor layers 12-$n$ and 14-$n$ after the sacrifice film 31 is embedded in the recess portion B1.

Fifth Embodiment

Figure 10:
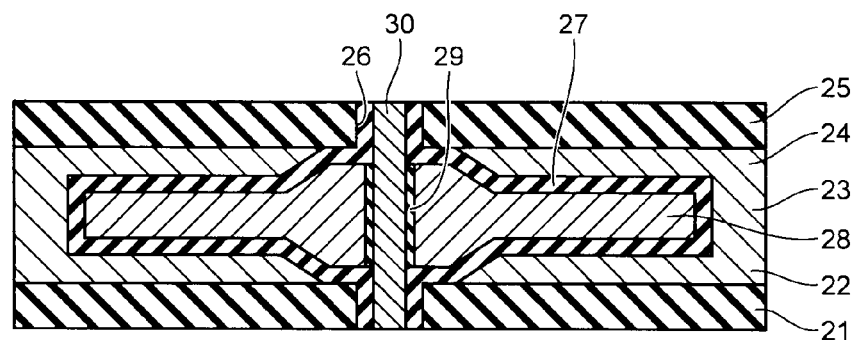
FIG. 10 is a cross-sectional view illustrating a schematic configuration of a semiconductor storage device according to a fifth embodiment.

FIG. 10 is a cross-sectional view illustrating a schematic configuration of a semiconductor storage device according to the fifth embodiment.

In FIG. 10, a floating gate electrode 28 is formed on a side surface of a columnar semiconductor 30 via a tunnel dielectric film 29. A channel region can be formed in the columnar semiconductor 30. The floating gate electrode 28 is configured such that a portion closer to the columnar semiconductor 30 is thicker than a portion further from the columnar semiconductor 30. For example, it is possible to form an upward slope from the portion further from the columnar semiconductor 30 toward the portion closer to the columnar semiconductor 30 on the floating gate electrode 28. This upward slope is preferably provided on both the upper and lower surfaces of the floating gate electrode 28. For example, this structure can be realized by adjusting the selectivity between the nonselective semiconductor layers 2-1, 4-1, 2-$n$, and 4-$n$ and the selective semiconductor layers 3-1 and 3-$n$ when etching the selective semiconductor layers 3-1 and 3-$n$ in FIG. 2B partway. Specifically, the semiconductor layers 3-1 and 3-$n$ are subjected to a wet etching under the condition where the semiconductor layers 2-1, 4-1, 2-$n$, and 4-$n$ are etched a little to reduce the size of the recess portion B1 toward the portion further from the columnar semiconductor 30, thereby forming the above structure.

Control gate electrodes 22 and 24 are formed on the upper and lower sides of the floating gate electrode 28 via a block dielectric film 27. The control gate electrodes 22 and 24 can be formed to extend over the thin portion and the upward slope of the floating gate electrode 28 and not to extend over the thick portion of the floating gate electrode 28. The floating gate electrode 28 can be configured to surround the columnar semiconductor 30 in a ring shape. The control gate electrodes 22 and 24 can be arranged on the side surface of the columnar semiconductor 30 via the block dielectric film 27. A control gate electrode 23 is formed on the outer peripheral sidewall of the floating gate electrode 28 via the block dielectric film 27, and the thin portion and the upward slope of the floating gate electrode 28 are surrounded by the control gate electrodes 22, 23 and 24 via the block dielectric film 27.

An inter-layer dielectric film 21 is formed under the control gate electrode 22 and an inter-layer dielectric film 25 is formed over the control gate electrode 24. A through hole 26 is formed in the inter-layer dielectric films 21 and 25. The columnar semiconductor 30 is embedded in the through hole 26 via the block dielectric film 27 to penetrate through the floating gate electrode 28.

In the above fifth embodiment, the floating gate electrode 28 is surrounded by the control gate electrodes 22, 23 and 24. Therefore, the coupling ratio between the control gate electrodes 22, 23 and 24 and the floating gate electrode 28 can be improved and the threshold voltage can be easily adjusted. The floating gate electrode 28 is configured such that the portion closer to the columnar semiconductor 30 is thicker than the portion further from the columnar semiconductor 30, so that the area of the floating gate electrode 28 facing the columnar semiconductor 30 can be made large compared with the first embodiment, whereby the threshold of the memory cell can be easily adjusted. In addition, in the present embodiment, the control gate electrode 22 is formed to be apart from the columnar semiconductor 30 by the film thickness of the block dielectric film 27 or more different from the first embodiment, so that leakage can be suppressed compared with the first embodiment, which is desirable. Moreover, the sacrifice film is not used in the process in the present embodiment, so that the number of processes can be reduced compared with the fourth embodiment.

In the embodiment in FIG. 10, explanation is given for the method of arranging the control gate electrodes 22 and 24 on the side surface of the columnar semiconductor 30 via the block dielectric film 27, however, the control gate electrodes 22 and 24 can be arranged on the side surface of the columnar semiconductor 30 via a tunnel dielectric film.

Sixth Embodiment

Figure 11:
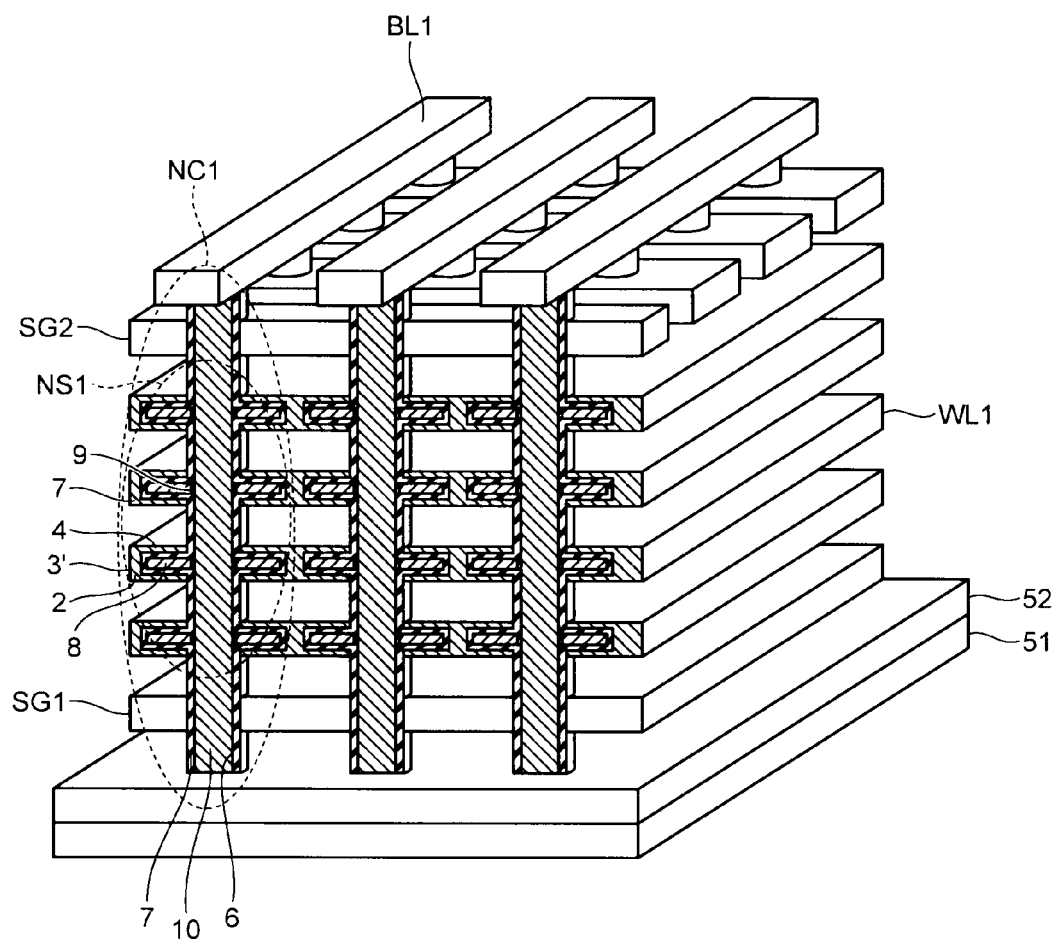
FIG. 11 is a perspective view illustrating a schematic configuration of a semiconductor storage device according to a sixth embodiment.

FIG. 11 is a cross-sectional view illustrating a schematic configuration of a semiconductor storage device according to the sixth embodiment. In the example in FIG. 11, a method is illustrated in which the memory cell in FIG. 1 is stacked for four layers and these four memory cells are connected in series to form a NAND string NS1. Moreover, in the example in FIG. 11, the inter-layer dielectric films 1 and 5 in FIG. 1 are omitted for simplification.

In FIG. 11, a well layer 52 is formed on a semiconductor substrate 51 and a select gate electrode SG1 is formed over the well layer 52. Moreover, word lines WL1 for four layers are stacked over the select gate electrode SG1, and a select gate electrode SG2 is formed over the uppermost word line WL1 for each row to form a NAND cell NC1. Furthermore, a bit line BL1 is formed over the select gate electrodes SG2 for each column. The word line WL1 can be formed of the control gate electrodes 2, 3', and 4 in FIG. 1.

The columnar semiconductors 10, each of which penetrates through the select gate electrodes SG1 and SG2 and the word lines WL1 for four layers, are formed on the well layer 52, and the upper end of the columnar semiconductor 10 is connected to the bit line BL1. The columnar semiconductor 10 can be arranged at the intersection of the bit line BL1 and the select gate electrode SG2.

The floating gate electrode 8 is formed on the sidewall of each of the columnar semiconductors 10 via the tunnel dielectric film 9 for each word line WL1. The block dielectric film 7 is formed along the sidewall of each of the columnar semiconductors 10 to surround the floating gate electrode 8, so that the control gate electrodes 2, 3', and 4 are insulated from the floating gate electrode 8 and the columnar semiconductor 10 and the select gate electrodes SG1 and SG2 are insulated from the columnar semiconductor 10.

Consequently, the NAND string NS1 can be formed by stacking the memory cells in each which the floating gate electrode 8 is surrounded by the control gate electrodes 2, 3', and 4, so that the integration density of the NAND flash memory can be improved while improving the coupling ratio between the control gate electrodes 2, 3', and 4 and the floating gate electrode 8.

In the embodiment in FIG. 11, the configuration in which the memory cell in FIG. 1 is stacked for four layers is explained, however, the memory cell in FIG. 1 can be stacked for n layers. Moreover, in the embodiment in FIG. 11, the method of using the memory cell in FIG. 1 is explained, however, the memory cell in FIG. 5 or FIG. 10 can be used.

Seventh Embodiment

Figure 12:
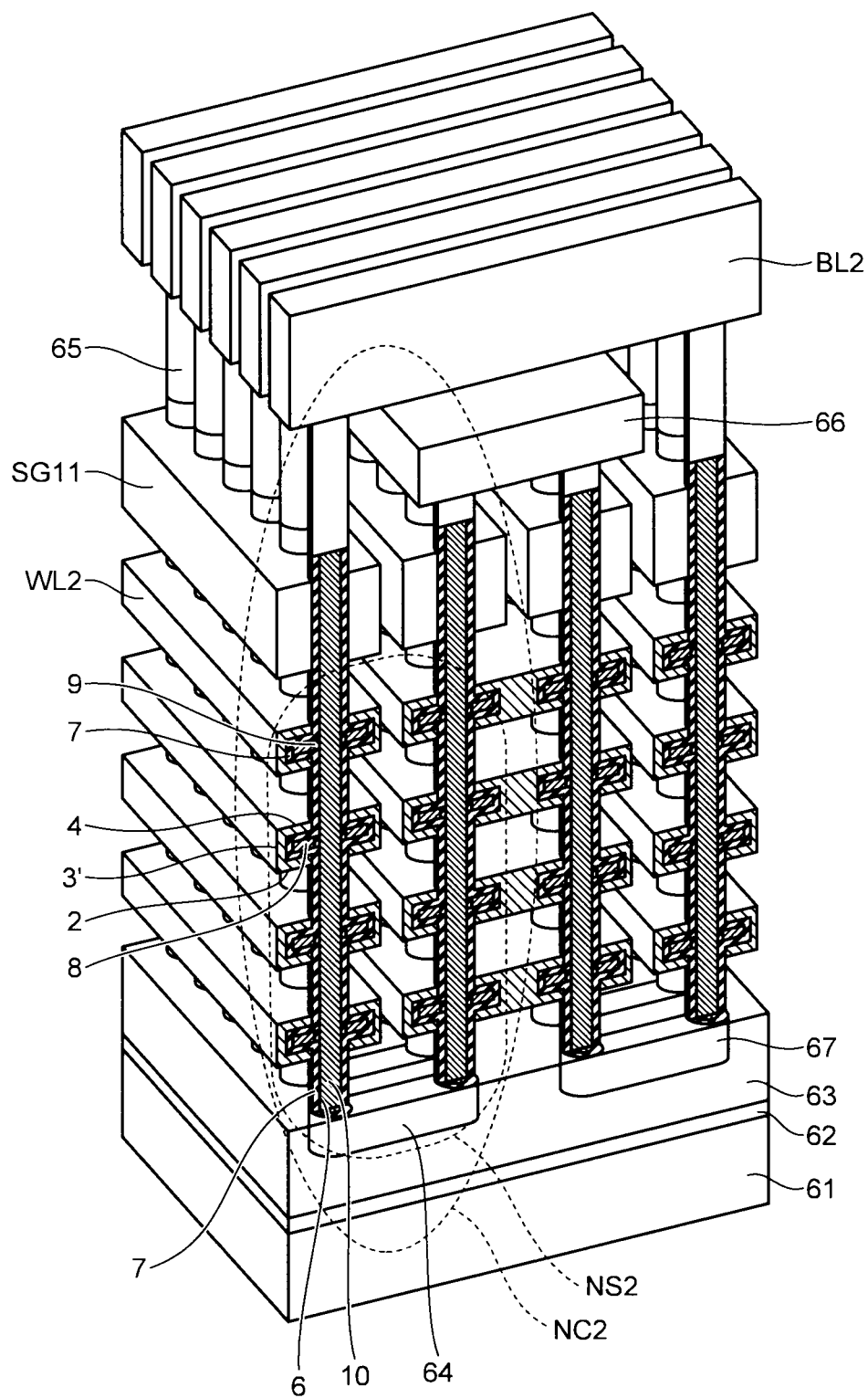
FIG. 12 is a perspective view illustrating a schematic configuration of a semiconductor storage device according to a seventh embodiment.

FIG. 12 is a perspective view illustrating a schematic configuration of a semiconductor storage device according to the seventh embodiment. In the example in FIG. 12, a method is illustrated in which a NAND string NS2 is formed of eight memory cells by stacking the memory cell in FIG. 1 for four layers and folding back the memory cells at the lower end of these four memory cells. Moreover, in the example in FIG. 12, the inter-layer dielectric films 1 and 5 in FIG. 1 are omitted for simplification.

In FIG. 12, a back gate electrode 63 is formed on a semiconductor substrate 61 via a dielectric layer 62. Word lines WL2 for four layers are stacked over the back gate electrode 63 and a select gate electrode SG11 is formed over the uppermost word line WL2 for each row to form a NAND cell NC2. Furthermore, a source line 66 is formed over the select gate electrodes SG11 and a bit line BL2 is formed over the source line 66 for each column. The word line WL2 can be formed of the control gate electrodes 2, 3', and 4 in FIG. 1.

The columnar semiconductors 10, each of which penetrates through the select gate electrode SG11 and the word lines WL2 for four layers, are formed on the back gate electrode 63. A connection layer 64 is formed on the back gate electrode 63 via a dielectric layer 67 and two columnar semiconductors 10 adjacent to each other along the bit line BL2 are connected to each other via the connection layer 64. For example, polycrystalline silicon can be used for the connection layer 64. Among the four columnar semiconductors 10 adjacent to each other along the bit line BL2, the upper ends of two columnar semiconductors 10 at both ends are connected to the bit lines BL2 via plugs 65 and the upper ends of the inner two columnar semiconductors 10 are connected to the source line 66. The columnar semiconductor 10 can be arranged at the intersection of the bit line BL2 and the select gate electrode SG11. The word line WL2 can be formed for each row. The two columnar semiconductors 10, which are connected to the source line 66 and are adjacent to each other, can share the word lines WL2.

The floating gate electrode 8 is formed on the sidewall of each of the columnar semiconductors 10 via the tunnel dielectric film 9 for each word line WL2. The block dielectric film 7 is formed along the sidewall of each of the columnar semiconductors 10 to surround the floating gate electrode 8, so that the control gate electrodes 2, 3', and 4 are insulated from the floating gate electrode 8 and the columnar semiconductor 10 and the select gate electrode SG11 is insulated from the columnar semiconductor 10.

Consequently, the coupling ratio between the control gate electrodes 2, 3', and 4 and the floating gate electrode 8 can be improved and the number of memory cells included in the NAND string NS2 can be increased without increasing the height of the columnar semiconductor 10, enabling to improve the integration density of the NAND flash memory.

In the embodiment in FIG. 12, the configuration in which the memory cell in FIG. 1 is stacked for four layers is explained, however, the memory cell in FIG. 1 can be stacked for n layers. Moreover, in the embodiment in FIG. 19, the method of using the memory cell in FIG. 1 is explained, however, the memory cell in FIG. 5 or FIG. 10 can be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a columnar semiconductor;
   a tunnel dielectric film that is provided on a side surface of the columnar semiconductor;
   a floating gate electrode having a first side surface facing the columnar semiconductor via the tunnel dielectric film, an upper surface, a lower surface and a second side surface opposite the first side surface;
   a block dielectric film that is provided to surround the floating gate electrode; and
   a control gate electrode including a U-shaped cross-sectional portion having upper and lower portions connected by a connecting side portion and that is provided to surround at least an end of the floating gate electrode including the second side surface via the block dielectric film, wherein
   the upper surface, the lower surface and the second side surface of the floating gate electrode are surrounded by and face the upper portion, the lower portion and the connecting side portion of the control gate electrode.

2. The semiconductor storage device according to claim 1, wherein the floating gate electrode is formed such that a portion closer to the columnar semiconductor is thicker than a portion further from the columnar semiconductor.

3. The semiconductor storage device according to claim 2, wherein the floating gate electrode includes a step from the portion further from the columnar semiconductor toward the portion closer to the columnar semiconductor.

4. The semiconductor storage device according to claim 2, wherein the floating gate electrode includes a slope from the portion further from the columnar semiconductor toward the portion closer to the columnar semiconductor.

5. The semiconductor storage device according to claim 1, further comprising a dielectric film formed on an upper portion and a lower portion of the control gate electrode, wherein
   a distance between the control gate electrode and the columnar semiconductor that face each other is at least partly same as a distance between the dielectric film and the columnar semiconductor that face each other.

6. The semiconductor storage device according to claim 1, further comprising a dielectric film formed on an upper portion and a lower portion of the control gate electrode, wherein
   a distance between the control gate electrode and the columnar semiconductor that face each other is larger than a distance between the dielectric film and the columnar semiconductor that face each other.

7. The semiconductor storage device according to claim 1, wherein a partial region of the control gate electrode includes a region in which an impurity concentration is lower than other regions.

8. The semiconductor storage device according to claim 1, wherein the floating gate electrode is arranged around the columnar semiconductor.

9. The semiconductor storage device according to claim 8, wherein the control gate electrode is arranged around the columnar semiconductor and includes a groove into which the floating gate electrode is inserted along an opposing surface to the columnar semiconductor.

10. The semiconductor storage device according to claim 1, wherein the control gate electrode is arranged on a side surface of the columnar semiconductor via the block dielectric film.

11. The semiconductor storage device according to claim 1, wherein n number of memory cells (n is a positive integer), each of which includes the floating gate electrode and the control gate electrode, are stacked in a height direction of the columnar semiconductor.

12. The semiconductor storage device according to claim 11, wherein the columnar semiconductor penetrates through floating gate electrodes and control gate electrodes of the n number of memory cells.

* * * * *